(12) United States Patent
Edamura et al.

(10) Patent No.: US 6,850,012 B2
(45) Date of Patent: Feb. 1, 2005

(54) PLASMA PROCESSING APPARATUS

(75) Inventors: Manabu Edamura, Chiyoda (JP);
Kazuyuki Ikenaga, Chiyoda (JP); Ken Yoshioka, Hikari (JP); Akitaka Makino, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/224,467

(22) Filed: Aug. 21, 2002

(65) Prior Publication Data

US 2003/0057845 A1 Mar. 27, 2003

(30) Foreign Application Priority Data

Sep. 11, 2001 (JP) ..................... P2001-274974

(51) Int. Cl.[7] .................................. H01J 7/24
(52) U.S. Cl. ................. 315/111.51; 118/723 I; 118/723 E
(58) Field of Search ............. 315/111.01–111.91; 118/723 I, 723 AN, 723 MR, 715, 718, 723 E; 204/192.12, 298.12, 298.16, 298.19; 156/345

(56) References Cited

U.S. PATENT DOCUMENTS

| 6,197,165 | B1 | * | 3/2001 | Drewery et al. ....... 204/192.12 |
| 6,273,022 | B1 | * | 8/2001 | Pu et al. .................... 118/723 I |
| 6,534,922 | B2 | * | 3/2003 | Bhardwaj et al. ....... 315/111.51 |

FOREIGN PATENT DOCUMENTS

| JP | 2-235332 | 9/1990 | ......... H01L/21/302 |
| JP | 7-106095 | 4/1995 | ............ H05H/1/46 |

* cited by examiner

*Primary Examiner*—Wilson Lee
(74) *Attorney, Agent, or Firm*—Antonelli, Terry, Stout & Kraus, LLP

(57) ABSTRACT

Induction coils of an induction coupling type plasma processing apparatus are divided into a plurality of coil elements and a plurality of lead wire portions for effecting connection between the coil elements. The coil elements are disposed inside of a process chamber, while the lead wire portions which effect connection between the coil elements are disposed outside of the process chamber. The coil elements disposed in the process chamber are in the form of short arcs as a result of the division thereof, so that they can be easily arranged symmetrically with respect to the center of the process chamber, whereby a uniform plasma distribution can be easily achieved.

10 Claims, 11 Drawing Sheets

PLASMA PROCESSING APPARATUS

BACKGROUND OF THE INVENTION

The present invention relates to a plasma processing apparatus of the type used in etching or film formation; and, more particularly, the invention relates to a plasma processing apparatus that is suitable for use in the production of a semiconductor device, a liquid crystal display substrate or the like.

In correspondence with efforts directed toward increasing the miniaturization of semiconductor devices and the like, process conditions (such as the process window) for enabling the attainment of uniform processing results in wafer plasma processing have become narrower year by year, so that plasma processing apparatuses in the future will be required to achieve more perfect control of such process conditions.

In order to realize this, an apparatus is needed which can control the distribution of a plasma, the dissociation of a process gas, the surface reactions in a reactor, and the like, with an extremely high degree of precision. At present, an example of a plasma source that can be used with such an apparatus is a high frequency induction coupling type plasma source.

For example, Japanese Patent Laid-open No. 2-235332 (1990), discloses an induction coupling type plasma processing apparatus in which an induction electric field is produced in a process chamber by a high frequency coil, to thereby accelerate electrons in a plasma, and energy is given to a process gas introduced into the process chamber, whereby generation and sustention of the plasma are achieved. The high frequency coil is mounted on the exterior of the process chamber with the use of insulator, such as a quartz insulator, that constitutes part of the process chamber. The high frequency coils are generally in the shape of a loop, a coil or a spiral, and high frequency electric power with a frequency of several hundreds of kHz to several hundreds of MHz is supplied thereto, thereby producing an induction electric field.

On the other hand, there also is a high frequency induction coupling type plasma processing apparatus having a structure in which a coil is provided inside the process chamber. For example, in a plasma processing apparatus disclosed in Japanese Patent Laid-open No. 7-106095 (1995), a spiral coil, serving as a high frequency induction coil, is disposed inside the process chamber at a position opposed to a semiconductor wafer, which is the workpiece to be processed.

Here, on an electric circuit basis, these plasma processing apparatuses can each be deemed to operate as a transformer in which the plasma and the high frequency coil are inductively coupled with each other, as a result of generation of an induction current in the plasma (a transformer with the high frequency coil as a primary coil and with the current path in the plasma as a secondary coil); hence, these plasma processing apparatuses are called induction coupling type plasma processing apparatuses.

The induction coupling type plasma processing apparatuses have certain advantages, in that a plasma with a comparatively high density of $10^{11}$ to $10^{12}$ ($cm^{-3}$) can be generated at a low pressure of several milliTorr, simply and inexpensively, by means of a simple coil and a high frequency power source. In addition, a plasma with a large area can be easily generated by arranging a coil in the form of a plain surface so that it is opposed to the workpiece to be processed; and, since the inside of the process chamber is simple, it may be possible to reduce the amount of foreign matter flying onto the workpiece during processing.

By use of an induction coupling type plasma processing apparatus, plasma with high density can be easily generated even at a low pressure, so that the mean free path of ions is enlarged. As a result, the directionality of ions incident on the workpiece to be processed is enhanced, so that the plasma process is suitable for minute processing, and a high processing rate can be obtained.

On the other hand, the above-mentioned apparatuses have the following problems.

For example, in the induction coupling type plasma processing apparatus disclosed in Japanese Patent Laid-open No. 2-235332 (1990) (hereinafter referred to as plasma processing apparatus 1), the high frequency coil is disposed in the atmosphere outside of the process chamber in which the plasma is generated, being mounted on the side of the process chamber through an insulator, such as quartz. Therefore, the insulator must have sufficient strength for enduring the atmospheric pressure, and when the workpiece to be processed is enlarged in area, as is expected in the future, the insulator must be enlarged in thickness accordingly. When the insulator is thus enlarged in thickness, the distance between the coil and the plasma is also enlarged. Then, as discussed, for example, in the paper by Keller et al, Journal Of Vacuum Science A11(5), September/October 1993 p.2487, the coupling condition between the coil and the plasma is worsened, the efficiency of formation of the plasma is lowered, and, as a result, the heat generation loss at the coil or a matching circuit is increased.

On the other hand, in recent years, the diameter of the wafer serving as the workpiece to be processed has progressively increased, and, as a result, it has become necessary to freely control the distribution of the plasma. In the induction coupling type plasma processing apparatus, it is possible to freely control the position of generation of plasma and to control the plasma distribution at the wafer position by, for example, varying the electric currents flowing respectively through two systems of coils and the ratio of the currents.

However, as empirically and theoretically shown in the paper by Collison et al, J. Vac. Sci. Technol. A 16-1, January/February 1998 p.100, even where two coils are used, the plasma is generated only at a mean position between the two induction coils, namely, only at one position in the vicinity of the area where the induction magnetic field of the coils is the strongest.

Thus, since the plasma is generated at one position, it is difficult to obtain a uniform plasma even by use of two systems of coils, unless the wafer is disposed at a certain distance from the coils. Therefore, in order to generate the plasma at two locations, it is necessary that the distance between the two coils is sufficiently large relative to the distance between the coils and the plasma.

However, in the case where the coil is disposed on the outside (atmosphere side) of the process chamber, as in plasma processing apparatus 1, the distance between the coil and the plasma cannot be reduced to or below a certain value. Therefore, where the distance between the two coils is enlarged, it is difficult to realize the required spacing with a substantial chamber size.

On the other hand, in the plasma processing apparatus disclosed in Japanese Patent Laid-open No. 7-106095 (1995) (hereinafter referred to as plasma processing apparatus 2), the coil is disposed in the chamber, whereby the above-mentioned problem due to coupling of the coil and the plasma can be solved, but another problem is newly generated.

First, in plasma processing apparatus 2, the high frequency coil is protected by a protective film formed of an insulator. Generally, in such an induction coupling type plasma processing apparatus, a strong plasma is generated at a position close to the coil. Therefore, the damage to the protective film is extremely heavy, particularly in an apparatus using a reactive gas, such as a plasma etching apparatus, and so there arises the need for increased maintenance, such as frequent repair or replacement of parts.

On the other hand, since the coil itself is metallic, when the protective film thereof is broken, metal ions are generated and the semiconductor wafer is contaminated with the metal. In this case, the coil itself also needs replacement, so that much time and cost are consumed for maintenance.

In addition, in plasma processing apparatus 2, a cooling plate is disposed on the rear side of the induction coil, and this plate must be insulated from the coil. In such a structure, it is difficult to achieve thermal coupling between the cooling plate and the coil.

In particular in a vacuum, or at a low pressure, as typically provided during plasma processing, heat transfer at a contact surface of the structures becomes extremely poor. Therefore, there arises the problem in that a large cooling effect on the coil owing to the arrangement of the cooling plate cannot be expected, and sufficient cooling cannot be realized.

Further, there is another problem in that plasma with a high density, as is present on the side of the workpiece to be processed, is generated also on the rear side of the coil disposed opposite to the work. However, the plasma on the rear side of the coil is not used effectively for plasma processing of the workpiece, and, in addition, the chamber wall on the rear side is exposed to this strong plasma.

Further, in an induction coupling type plasma processing apparatus, whether the apparatus may be of the type in which the coil is disposed on the atmosphere side, as in the plasma processing apparatus 1, or of the type in which the coil is disposed on the vacuum side, as in the plasma processing apparatus 2, electrons are accelerated directly by the voltage exerted on the coil, and the plasma is generated on the basis of capacitive coupling.

In this case, in the above-mentioned plasma processing apparatuses of either type, uniformization of the potential distributed in the coil has not been taken into account, and so a question arises as to the formation of a uniform plasma.

SUMMARY OF THE INVENTION

The present invention has been made in consideration of the above-mentioned problems. Accordingly, it is an object of the present invention to provide a plasma processing apparatus of the induction coupling type which can securely generate a uniform plasma.

It is another object of the present invention to provide a plasma processing apparatus which can easily generate a stable plasma with a high efficiency, at a free location and under wide conditions, while solving the questions as to the uniformity of plasma questions, by taking into account the problems of surface protection and cooling of the induction coil and the problem of lowering of the efficiency of the plasma use due to the plasma generated on the rear side of the coil, as compared with the plasma processing apparatus 1.

It is a further object of the present invention to provide a plasma processing apparatus which is high in reliability and easy to maintain.

The foregoing objects can be attained by an induction coupling type plasma processing apparatus comprising an induction coil for generating a plasma comprised of at least one coil turn disposed in a process chamber, wherein the induction coil is divided into a plurality of portions disposed within the process chamber, and a plurality of portions disposed outside of the process chamber.

In the above-described apparatus, the induction coil for generating the plasma may be comprised of at least two systems of induction coils arranged in the shape of concentric circles extending from the center of the process chamber.

In addition, the plurality of portions of the induction coil, which are disposed within the process chamber, may be provided in the form of parts of concentric circles arranged with respect to the center of the process chamber, and the coil portions may be arranged in the form of parts of a spiral starting from the center of the process chamber.

Further, a conductive plate member, that is provided with slits in directions roughly orthogonal to the plurality of portions disposed in the process chamber, may be provided between the induction coil and a plasma generation space in the process chamber, or a magnetic field applying means may be provided in the process chamber.

Besides, the at least two systems of induction coils may each be controlled with regard to the distribution of electric power thereto, and a predetermined voltage, including zero voltage, relative to a common potential may be applied to the conductive plate member. Here, a means for applying different voltages to the conductive plate member at the time of ignition of the plasma and after ignition of the plasma may be provided.

More specifically, according to one embodiment of the present invention, the induction coil is divided into a plurality of coil elements, which are disposed on the vacuum side of a chamber window (cover member) that is comprised of an insulator, whereby the coupling property with the plasma is enhanced. At this time, the coil is covered with another insulator cover, relative to the plasma, with another insulator and a slit conductor disposed therebetween.

The slit conductor is connected to a high frequency power source, and it functions as a shield for preventing generation of a capacitive coupling plasma due to the voltage on the coil, thereby realizing uniformity of the plasma in the circumferential direction and controlling the incidence of ions on the inside surface of the chamber.

In addition, the individual elements of the divided induction coil are connected by lead portions disposed on the outside (atmosphere side) of the process chamber. Each of the coil elements is so arranged as to have a slight radial component. With this arrangement, the plasma is guided in the radial direction, in addition to the ordinary angular direction, whereby the plasma generation region is enlarged in the radial direction, the acceleration distance for electrons is shortened, and electron temperature is lowered.

Thus, a uniform plasma distribution can be obtained, even if the semiconductor wafer is located near the plasma generation area. With the plurality of systems of induction coils thus arranged, a plasma can be generated with respect to each of the coils, and the distribution of the plasma and radicals can be freely controlled.

Since each of the coil elements is small in length and both ends thereof are exposed on the outside (atmosphere side) of the process chamber, the temperature of the coil elements can be lowered by using a metal with a high thermal conductivity, such as aluminum, therefor and cooling the portions exposed in the atmosphere by a fan or the like. In particular, it is unnecessary to arrange a coolant passage on the vacuum side.

BRIEF DESCRIPTION OF THE DRAWINGS

Other objects and advantages of the invention will become apparent from the following description of various embodiments, with reference to the accompanying drawings in which.

DETAILED DESCRIPTION OF THE PREFERRED EMBODIMENTS

A plasma processing apparatus according to an embodiment of the present invention will be described in more detail with reference to the drawings.

The present invention is not limited to the field of semiconductor device production, but may be applied to the production of liquid crystal displays, the formation of films of various materials, and to surface treatments. Here, one embodiment involving the application of the present invention to a plasma etching apparatus for production of semiconductor devices will be described.

Figure 1:
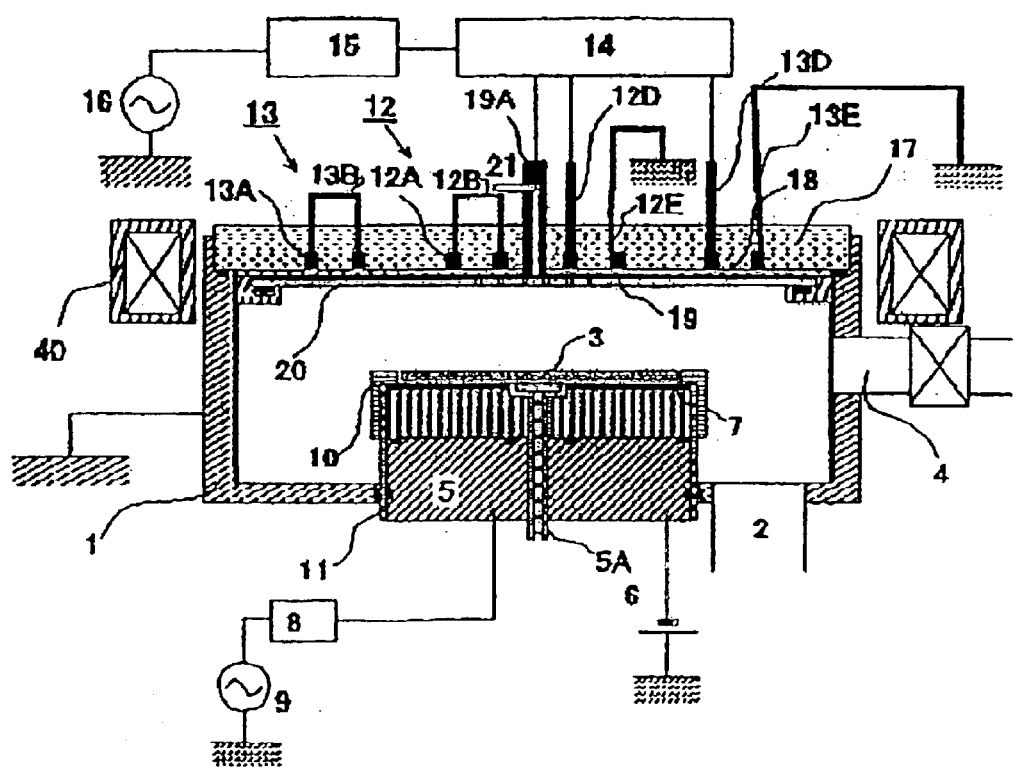
FIG. 1 is a diagrammatic sectional view of a plasma processing apparatus according to an embodiment of the present invention.

FIG. 1 shows one embodiment of the present invention. In the figure, a process chamber 1 is formed as a bottomed cylinder-shaped vacuum vessel, that is made of, for example, aluminum, and whose surface is alumite-treated or stainless steel. As shown, the process chamber 1 is ground, and is kept at a common potential.

The process chamber 1 is provided with a vacuum exhaust means 2, and a conveying system 4 is provided for conveying a semiconductor wafer, which is the work to be processed, in and out of the processing chamber. An electrode device 5, functioning as a stage on which the semiconductor wafer 3 is mounted, is disposed inside of the process chamber 1.

The semiconductor wafer 3 is mounted on the electrode device 5. The semiconductor wafer 3 is fed into the process chamber 1 by the conveying system 4, is placed on the electrode device 5, and is thereafter attracted electrostatically by an electrostatic chuck 7 connected to a DC power source 6, so as to be held on the electrode device 5.

To that end, the electrode device 5 is entirely formed of a metal, such as aluminum or stainless steel. On the other hand, the electrostatic chuck 7, that is disposed on the upper side of the electrode device 5, is formed of an insulator, such as a ceramic regulated in dielectric constant, and a DC voltage of about several hundreds of volts is applied thereto from the DC power source 6 so as to generate an electrostatic force, thereby attracting the wafer 3 thereto.

The electrode device 5 is supplied with a high frequency voltage at a frequency of several hundreds of kHz to several tens of MHz from a high frequency power source 9 through a matching circuit 8, whereby the energy of the ions incident on the semiconductor wafer 3 during plasma processing is controlled.

A coolant passage, not shown, is provided inside of the electrode device 5, whereby the temperature of the wafer 3, during the processing thereof with a plasma, is restrained from being raised due to heating by the plasma, and the wafer 3 is maintained at a fixed temperature.

For promotion of heat transfer, a non-reactive gas such as helium (He), is introduced to the space between the wafer 3 and the electrode device 5 through a passage 5A at a pressure of about several Torr to ten and several Torr. Further, the surface of the electrode device 5, in the areas other than the wafer-mounting surface, is provided with a susceptor 10 and a cover 11, both of which are made of an insulator, whereby the electrode device 5 is protected from the plasma and a reactive gas.

Next, in order to isolate the inside of the process chamber 1 from the atmospheric air, a cover member 17 consisting of a circular plate formed of an insulator, such as quartz or alumina ceramic, is mounted as a cover on the upper side of the process chamber 1 in a gas-tight manner. On the inner side of the cover member 17, two systems of induction coils 12, 13 are disposed opposite to the wafer 3 and are clamped between the cover member 17 and a circular plate member 18, which is also formed of an insulator, such as quartz or an alumina ceramic. With this arrangement, a high frequency coil system, that is the characteristic feature of the present invention, is formed.

Figure 2:
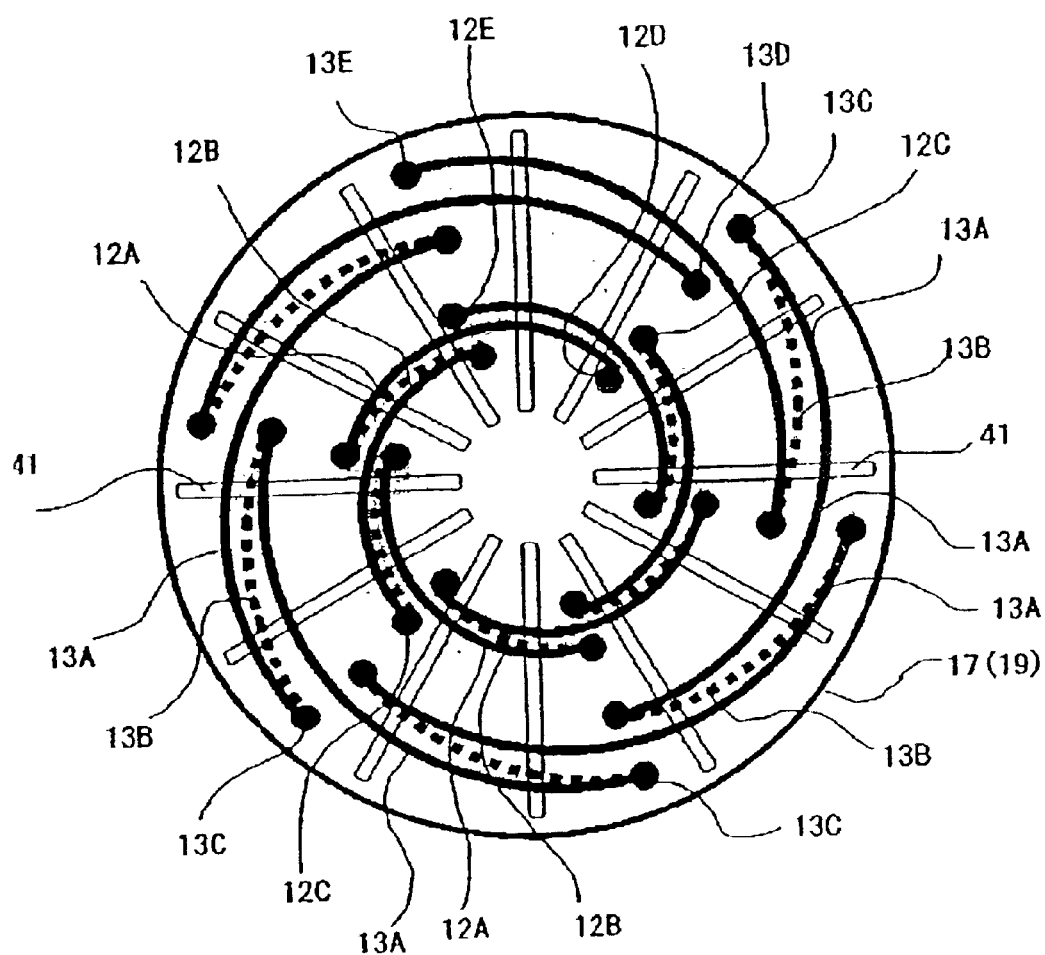
FIG. 2 is a diagrammatic plan view of the plasma processing apparatus according to the embodiment of the present invention.

As will be detailed later, each of the two systems of induction coils 12, 13 is divided into a plurality of elements according to a predetermined pattern, as shown in FIG. 2, and each of the elements is connected to a high frequency power source 16 through a power branch circuit 14 and a matching circuit 15. While two systems of induction coils are provided in consideration of the controllability of distribution in this embodiment, more systems may be provided. On the other hand, where distribution control is not so important, one system of induction coils may be adopted.

A conductor 19, consisting of a metallic disk, is provided on the inner side of the plate member 18, covering the induction coils 12, 13. The conductor 19 is provided with a plurality of radial slits 41, as shown in FIG. 2. A power supply line 19A is led out from the vicinity of the center of the conductor 19 to the outside of the cover member 17, and it is connected to the high frequency power source 16 through the power branch circuit 14 and the matching circuit 15.

As will be described in detail later, with the conductor 19 thus provided, the capacitive coupling between the plasma and the induction coils 12, 13 in the process chamber 1 is hindered. Since the capacitive coupling contributes to the ignition of the plasma, it is difficult for the plasma to be ignited where the conductor 19 is provided.

This problem can be easily solved by a series of steps involving an ignition sequence which comprises controlling the power branch circuit 14, by first distributing a large amount of high frequency power to the conductor 19 at the time of ignition of the plasma, thereby effecting a promotion of the ignition of the plasma, and thereafter distributing high frequency power principally to the induction coils 12, 13, to thereby increase the density of the plasma.

A cover 20, consisting of an insulator plate member, is provided on the inner side of the conductor 19, whereby the conductor 19 is isolated from the plasma generation space in the process chamber 1. The cover 20 is provided, roughly at its central portion, with a plurality of blow-off ports 21A that communicate with a process gas piping 21, whereby a process gas is introduced into the process chamber 1. In addition, in this embodiment, an air-core coil 40 is provided on the outside of the process chamber 1, whereby a predetermined magnetic field is applied to the plasma in the process chamber 1, so that transport of the plasma can be controlled. However, this is not an indispensable requirement.

Now, details of the induction coils 12, 13 will be described with reference to FIG. 2. First, in FIG. 2, the arc-shaped thick solid lines represent a plurality of coil elements 12A, 13A constituting major parts of the coil disposed in the vacuum in the process chamber 1, and the thick broken lines represent lead wire portions 12B, 13B that are disposed in the atmospheric air outside of the process chamber and which connect the coil elements. The solid circles at end portions of the coil elements 12A, 13A represent lead-out portions 12C, 12D, 12E, 13C, 13D, 13E of the lead wires extending between the inside and the outside.

In order to reduce the influence on the plasma, it is desirable that the lead-out portions of the lead wire should not overlap with the positions of the above-mentioned slits 41. To illustrate this, the slits 41 provided in the conductor 19 are also drawn in FIG. 2.

As will be described later with reference to FIGS. 3 to 8, there are various patterns, which result from the dividing method and connecting method employed in the formation of the plasma-generating induction coils, according to various embodiments of the present invention. FIG. 2 shows one example of a preferred embodiment of the high frequency coil system. Here, the two systems of plasma-generating induction coils 12, 13 are each comprised basically of two coil turns, and each of the two coil turns is divided into three portions, so that six coil elements are used for each of the systems.

In more detail, first, the two systems of induction coils 12, 13, in the embodiment shown in FIG. 2, are disposed roughly in the shape of concentric circles, while being divided radially between the inner circumferential side and the outer circumferential side of the circular cover member 17. Here, as shown, the inner side accommodates the induction coil 12, and the outer side accommodates the induction coil 13.

These induction coils 12, 13 are comprised of the respective six coil elements 12A, 13A, represented by the arc-shaped thick solid lines, and the respective five lead wire portions 12B, 13B, represented by the thick broken lines. Here, each of the coil elements 12A, 13A is formed as an arc constituting part of a spiral extending gradually from the inner circumferential side toward the outer circumferential side, and the coil elements 12A, 13A are so arranged that each coil element sequentially overlaps with the next coil element over half of the length thereof.

Each of the coil elements 12A, 13A is led out into the atmospheric air on the outside of the cover member 17 by the lead wires at the lead-out portions 12C, 13C provided at both ends thereof, and each coil element is sequentially connected to the next coil element by a respective one of the lead wire portions 12B, 13B. In this case, the adjacent coil elements are connected in the manner of being folded back at the overlapping portion thereof, whereby two coil turns are formed as a whole, as has been described above.

At this time, as shown in FIG. 1, each of the lead wire portions 12B, 13B is spaced above the upper side of the cover member 17, whereby it is disposed at a sufficient distance from the plasma generated in the process chamber 1.

Of the coil elements 12A, 13A, the first coil end portions are made to be the lead-out portions 12D, 13D, whereas the last coil end portions are made to be the lead-out portions 12E, 13E; and, as shown in FIG. 1, the lead-out portions 12D, 13D on one side are connected to the power branch circuit 14, whereas the lead-out portions 12E, 13E on the other side are grounded.

There are various patterns according to the dividing method and the connecting method employed for formation of the induction coils constituting the high frequency coil system in the embodiment of the present invention. How to divide the coils, how to arrange the coil elements, and how to connect the coil elements will vary depending on the frequency to be used, the inductances of the coils, the current that passes through the coils and the amount of heat generated, the distribution of the plasma to be generated, and the like.

Figure 3:
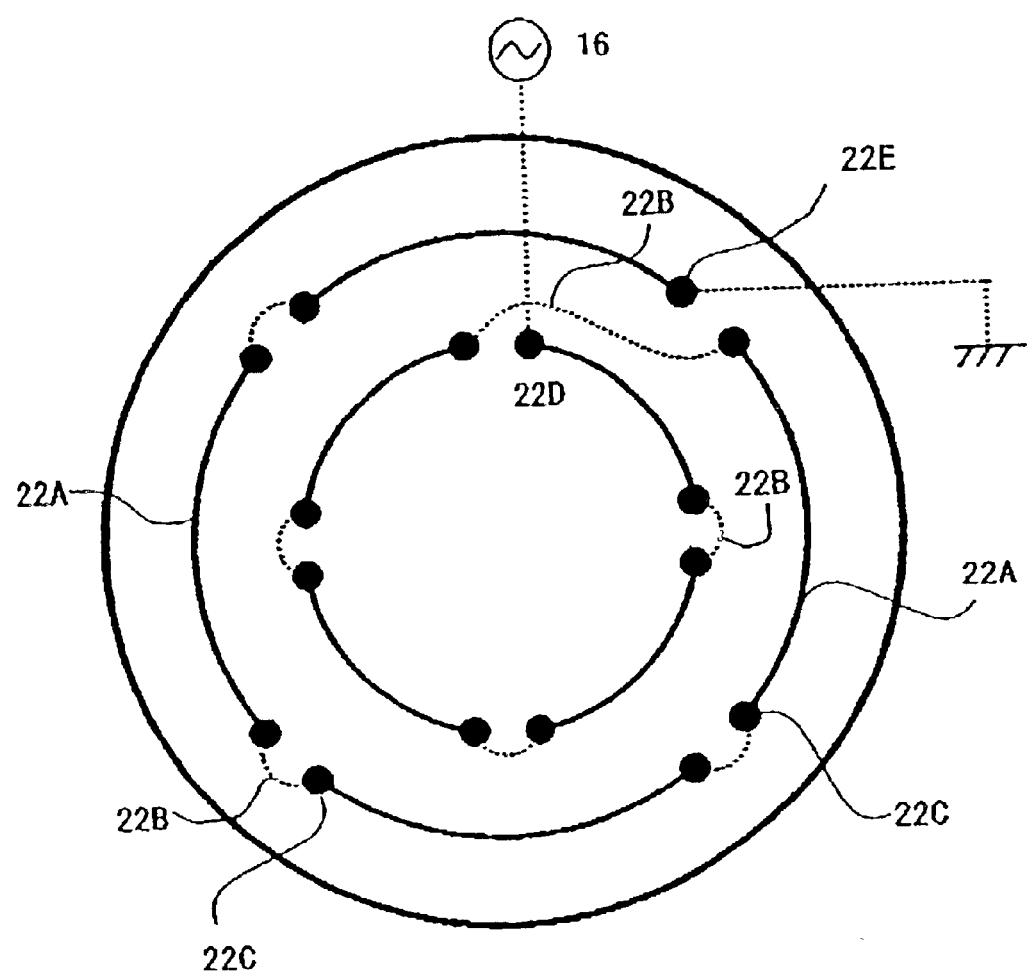
FIG. 3 is a diagram of a first embodiment of an induction coil according to the present invention.

Before describing the operation of the above-described embodiment, the dividing method and the connecting method employed for formation of the induction coils to be obtained as various patterns according to embodiments of the present invention will be described. First, FIG. 3 shows an embodiment according to the most basic pattern, wherein the induction coil is basically comprised of two coil turns.

Each of the two coil turns is divided into four portions to obtain a total of eight coil elements 22A, and end portions of these coil elements are connected by lead wire portions 22B to obtain two coil turns. The end portion 22D on one side is connected to the high frequency power source 16, whereas the end portion 22E on the other side is grounded.

Here, naturally, the coil elements 22A are provided inside of the process chamber 1, and the lead wire portions 22B are led out to the outside. It is desirable that the lead wire portions 22B of each coil element, that are present on the atmosphere side, are disposed at a sufficient distance from the plasma so as not to influence the plasma.

Here, in the case of an induction coil of the type used in a conventional plasma processing apparatus, the symmetry of the structure is broken due to the manner of winding the coil, and so a plasma is generated in a deviated form. On the other hand, in the case of the high frequency coil system according to the embodiment shown in FIG. 3, only the coil elements 22A, which are portions to be coupled with the plasma, are arranged in the process chamber 1, and the lead wire portions 22B are led out to the atmosphere side.

In this embodiment, the only elements which contribute to a nonuniform structure according to the manner of winding the induction coil are the lead wire portions 22B. The lead wire portions 22B are all disposed in the atmospheric air, and the coil elements 22A, obtained by dividing the coils into short portions, are all symmetric with respect to the center of the process chamber. Therefore, according to the embodiment shown in FIG. 3 and the embodiments shown in FIG. 4 and the later figures, a deviation of the plasma due to the manner of winding the coils can be prevented, and a uniform plasma can be securely generated.

In the case of FIG. 3, although the coil elements are arranged symmetrically, the voltage applied to the induction coil as a whole is not uniform; namely, the voltage is higher at the coil elements on the side of the high frequency power source 16 and is zero voltage on the ground side. Therefore, if a plasma of the capacitive coupling type is generated, in which electrons are accelerated directly by the voltage applied to the coil, the plasma being generated is stronger at a higher voltage portion, resulting in asymmetry.

To obviate this problem, though not shown in FIG. 3 and the later figures, the conductor 19, which is provided with the slits 41 extending in directions roughly orthogonal to the coil elements and which is grounded, is provided between the coils and the plasma so as to serve as a shield, as shown in FIG. 1. With this arrangement, capacitive coupling between the coils and the plasma can be prevented, asymmetry due to capacitive coupling can be restrained, and axial symmetry of the plasma can be perfectly achieved.

Besides, by connecting the conductor 19 to a power source with a predetermined voltage in place of grounding the conductor 19, it is possible to control the ions incident on the cover 20, that is provided between the conductor 19 and the plasma, and to control a reaction on the surface of the cover 20.

Figure 4:
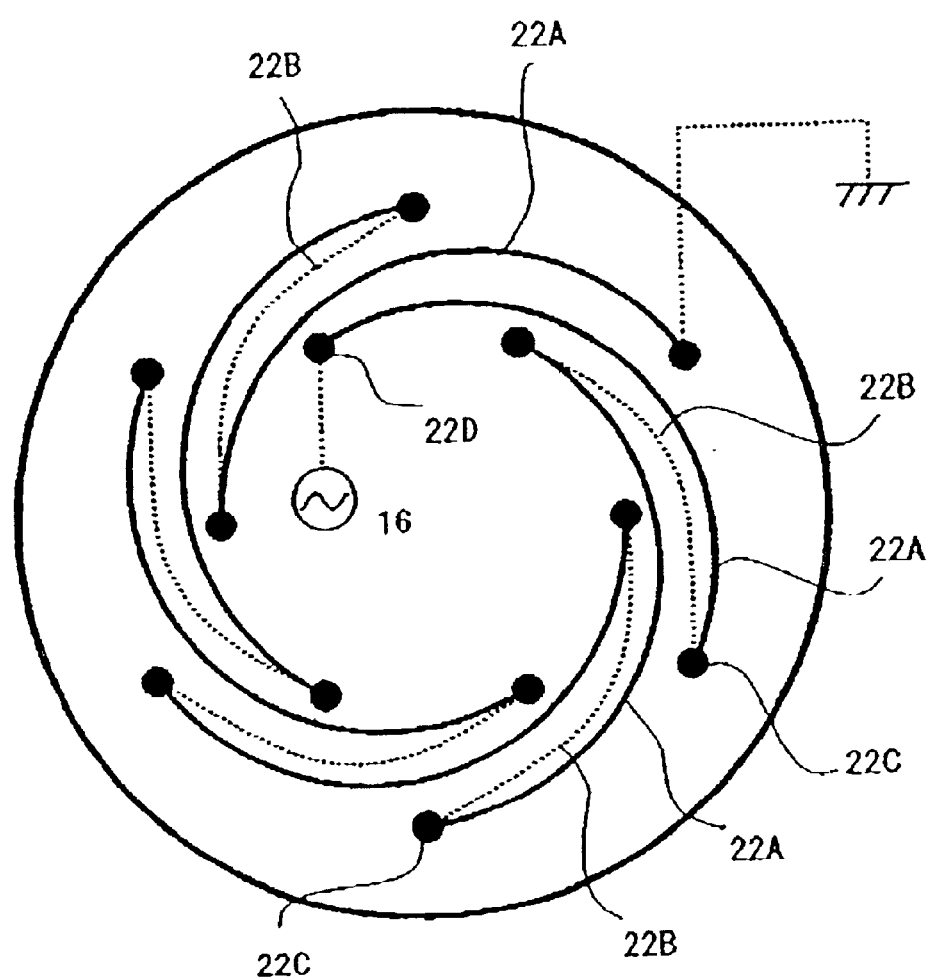
FIG. 4 is a diagram showing a second embodiment of the induction coil according to the present invention.

FIG. 4 shows one embodiment in which each coil element 22A is arranged as an arc constituting part of a spiral extending gradually from the inner circumferential side toward the outer circumferential side, namely, arranged so as to be slightly inclined, deviating from the circular circumferential direction. In this case, the individual coil elements 22A can be arranged so that they overlap with each other, as compared to the pattern shown in FIG. 3, so that the number of coils can be increased.

As a result, the embodiment shown in FIG. 4 can have the advantage that the uniformity in the circular circumferential direction is further enhanced, as well as another advantage in that the electron temperature of the plasma being generated is lowered. In such a case, generally, electrons are accelerated on a circular circumference along the electric field generated by the induction coil. Here, as the most general example, under a pressure of about 1 Pa and a discharge frequency of 13.56 MHz, almost all of the electrons are accelerated until they collide with some particles, such as neutral gas molecules and radicals.

On the other hand, in the case of the embodiment shown in FIG. 4, the coil is inclined, so that the electrons are slightly accelerated in the radial direction, and some electrons deviate from the accelerating electric field. As a result, the electron temperature is suppressed to a low level. Here, the effect of such lowering of the electron temperature due to the acceleration distance of electrons is discussed in, for example, the paper by Shindo et al, "Appl. Phys. Left." Vol.76, No.10, 6 Mar. 2000 p.1247. Further, the plasma generation position is widened in the radial direction. Therefore, uniformization can be easily achieved even where the wafer position is close to the plasma generation area.

It should be noted here that, where the inclination of the coil elements is small, the induction electric field is so generated as to accelerate the electrons substantially in a ring form. Therefore, the degree of inclination must be carefully determined, because it depends heavily on the size of the discharge and the degree of coupling between the coil elements and the plasma.

Figure 5:
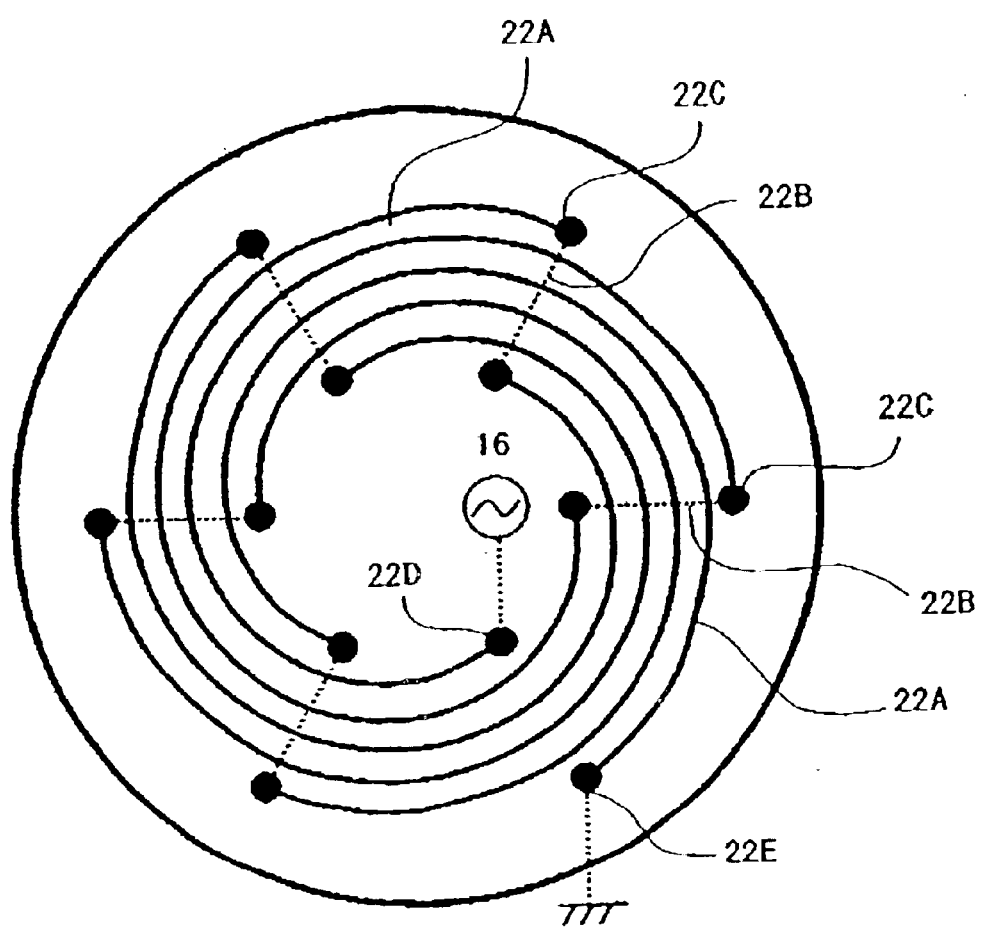
FIG. 5 is a diagram showing a third embodiment of the induction coil according to the present invention.

FIG. 5 also shows one embodiment in which each coil element 22 is arranged so as to be slightly inclined, deviating from the circular circumferential direction. In this embodiment, each coil element 22A is elongated to a length of roughly 5/6 of a turn (about 300° in terms of angle) in the circumferential direction. With this arrangement, the connection distance between the coil elements constituting different turns is shortened, so that the lead wire portions 22B can be short, and the layout of the connection wires on the atmosphere side becomes rational.

Figure 6:
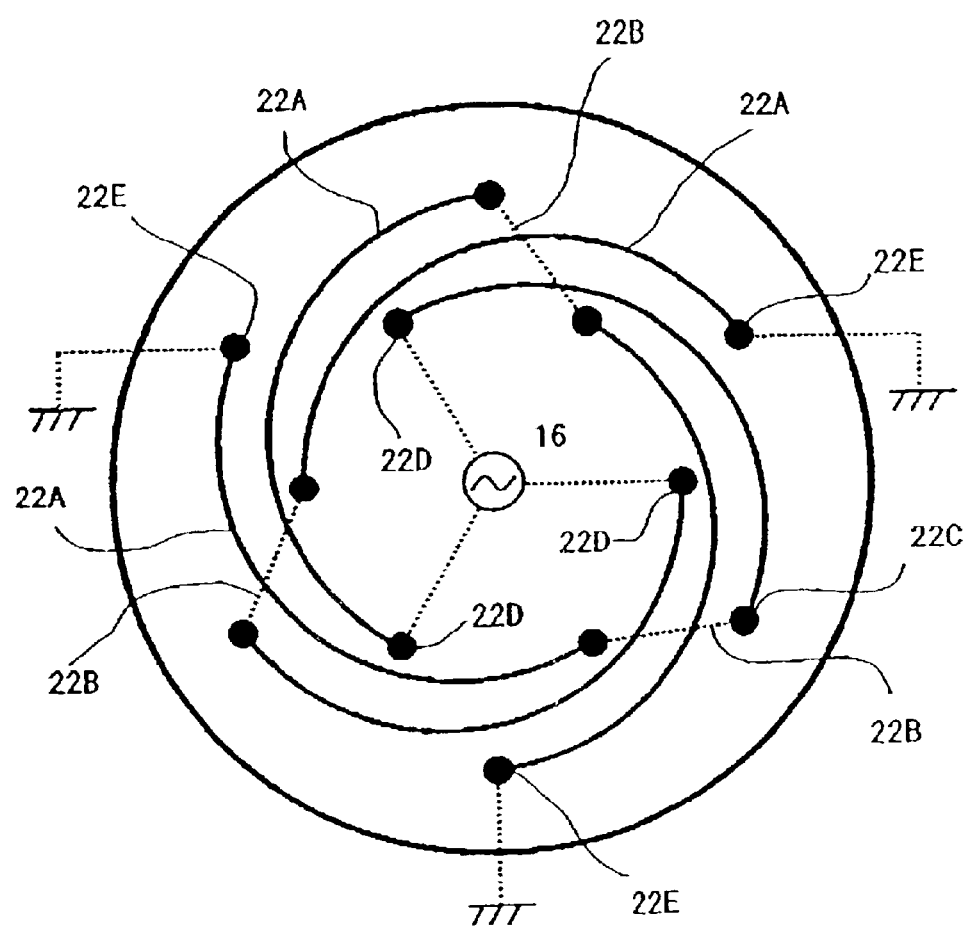
FIG. 6 is a diagram showing a fourth embodiment of the induction coil according to the present invention.
Figure 7:
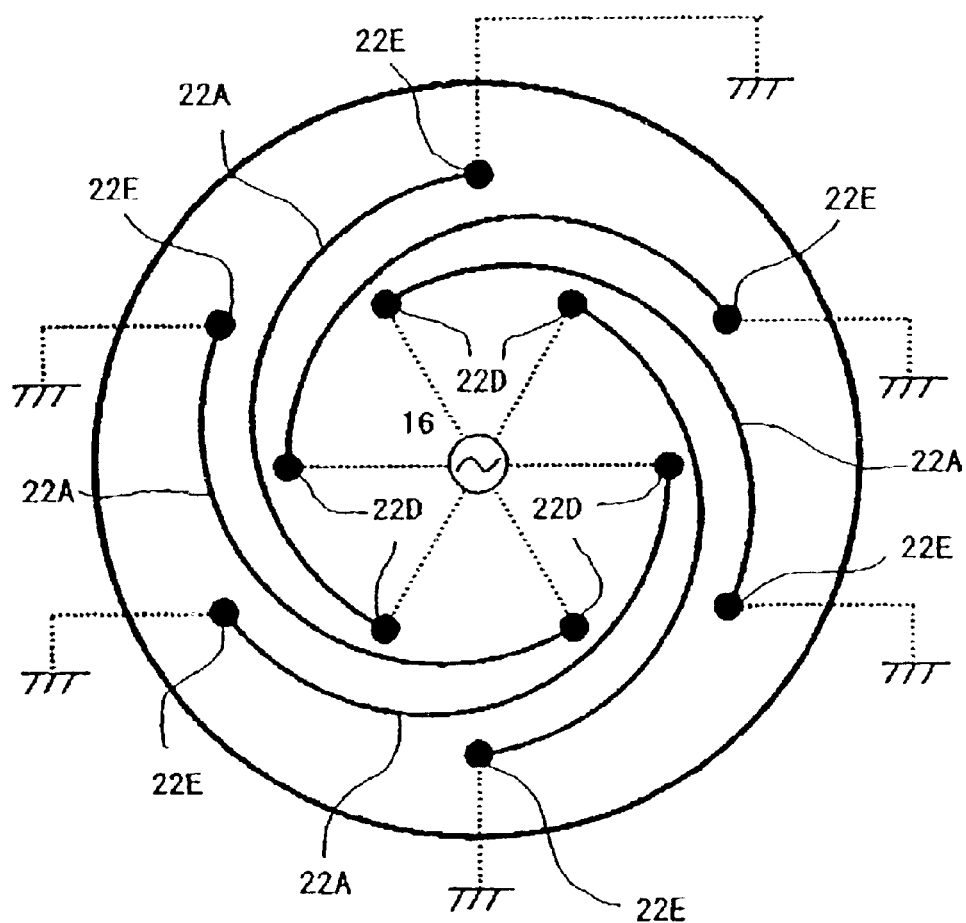
FIG. 7 is a diagram showing a fifth embodiment of the induction coil according to the present invention.

At present, a discharge frequency of about 13.56 MHz is generally used with such a plasma processing apparatus. In this case, there have been reported various effects resulting from a raising of the discharge frequency, such as a lowering of the electron temperature. Thus, it is advantageous to raise the frequency in some processes. Where the discharge frequency is thus raised, it is necessary to lower the inductance of the load (in this case, the induction coil). FIGS. 6 and 7 show embodiments in which it is possible to fulfill such a need. These embodiments adopt the same coil division as that in the embodiment of FIG. 4, but differ from the embodiment of FIG. 4 in the manner of connection of the coil elements.

Here, the embodiments shown in FIGS. 6 and 7 represent cases where the coil elements are connected in parallel, whereby the total inductance can be suppressed to a low level. In FIG. 6, the six coil elements 22A are connected in series in pairs to form three series circuits, which series circuits are connected in parallel to form a three-element parallel coil circuit. In FIG. 7, all of the six coil elements 22A are connected in parallel to form a six-element parallel coil circuit.

In this case, the number of series circuits and the number of parallel circuits are not limited to those specified by the connecting methods shown in FIGS. 6 and 7. A variety of connection patterns may be considered, which are all included in the present invention.

Figure 8:
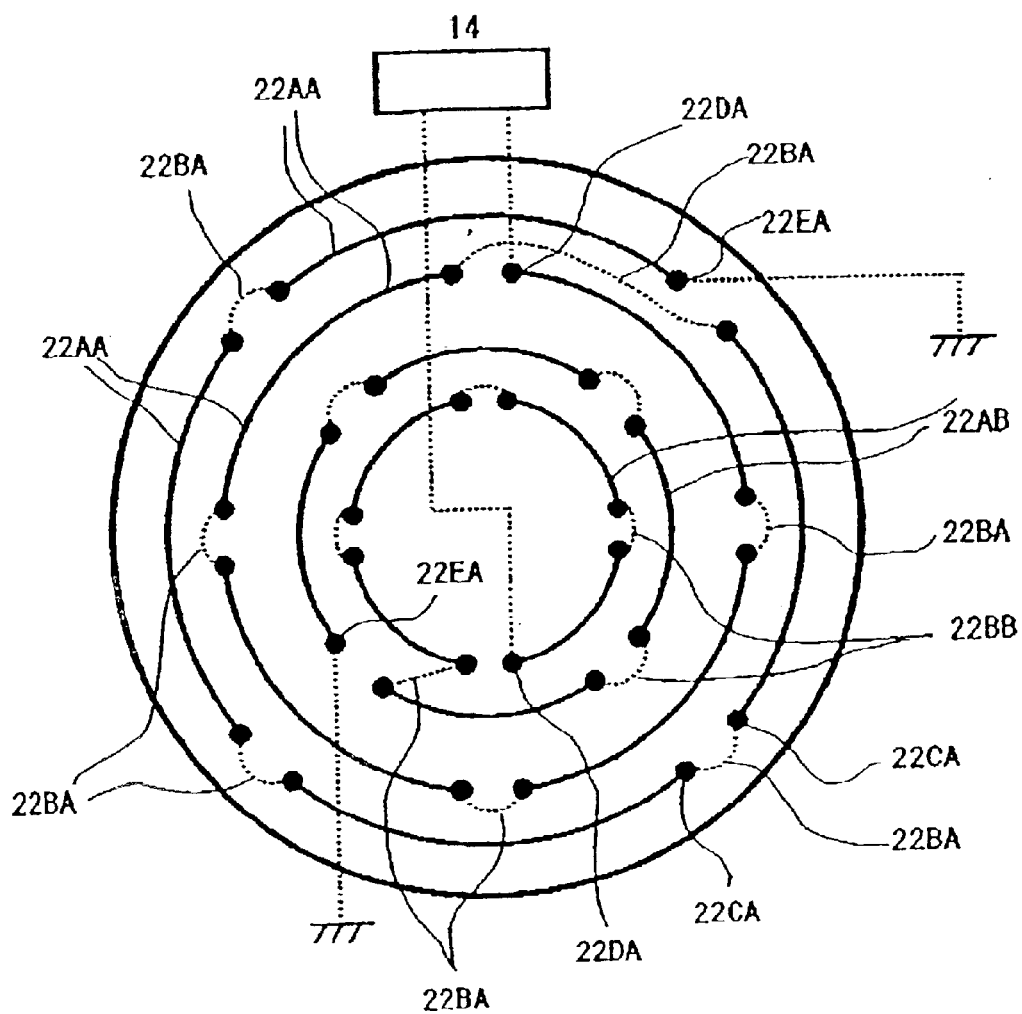
FIG. 8 is a diagram showing a sixth embodiment of the induction coil according to the present invention.

FIG. 8 shows one embodiment in which a coil division form similar to that in the embodiment shown in FIG. 3 is used, and a further system of the induction coil is provided in the vicinity of the center for control of the distribution of the plasma. Here, A is appended to the reference numerals denoting the elements of the induction coil on the inner side, and B is appended to the reference numerals denoting the elements of the induction coil on the outer side.

In the case of the embodiment shown in FIG. 8, distribution of high frequency electric power to the outside induction coil and the inside induction coil is varied by the power branch circuit 14 shown in FIG. 1, whereby the distribution of plasma can be freely controlled.

In addition, in the case of FIG. 8, the distance between the outside induction coil and the inside induction coil is set to be sufficiently large relative to the distance between these coils and the plasma, whereby plasmas can be generated at separate positions, respectively, by the coils. Therefore, when the distribution of electric power to the outside and inside induction coils is varied by the power branch circuit 14, the distribution of plasma can be controlled in a much wider range.

Figure 9:
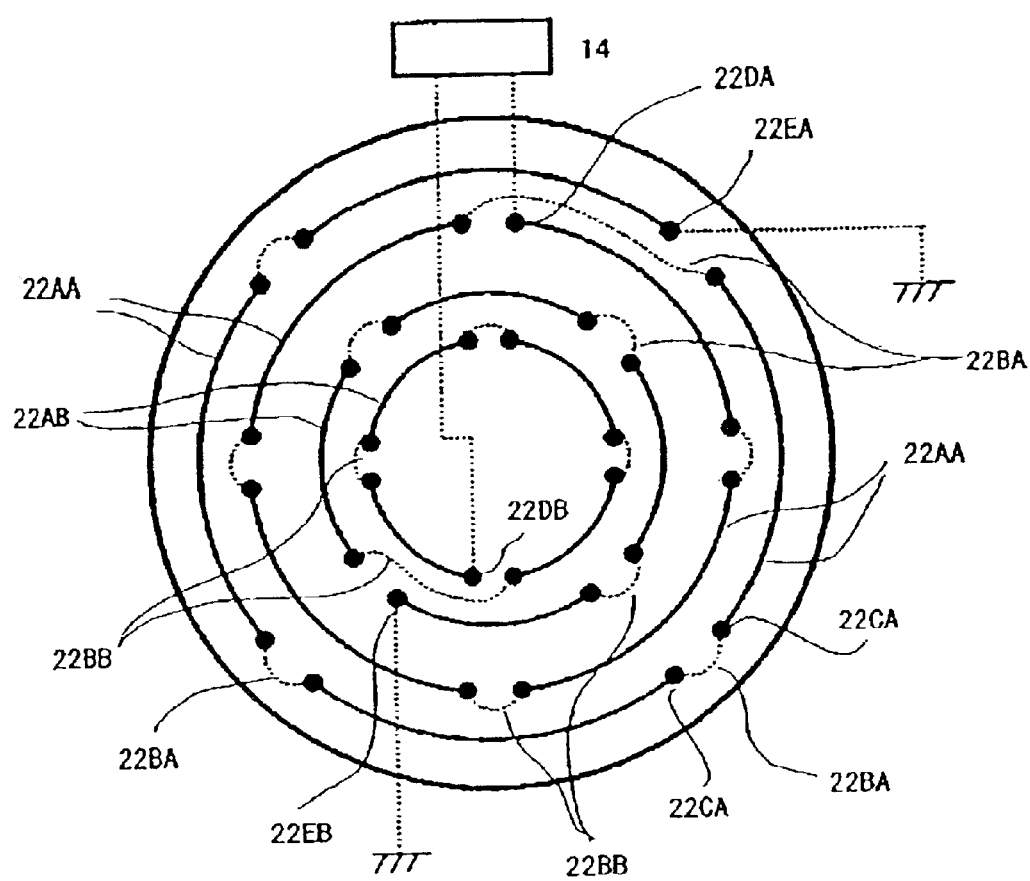
FIG. 9 is a diagram showing a seventh embodiment of the induction coil according to the present invention.

FIG. 9 shows a constitution that is roughly the same as that of FIG. 8, and it represents an embodiment in which the directions of the electric currents flowing through the outside coil, denoted by reference numerals to which A is appended and through the inside coil denoted by reference numerals to which B is applied, are reverse to each other. In this case, the induction magnetic fields cancel each other between the coil elements 22AA of the outside coil and the coil elements 22AB of the inside coil.

Therefore, in the case of the embodiment shown in FIG. 9, even if the distance between the outside coil and the inside coil is shorter, as compared with that in the embodiment shown in FIG. 8, it is possible to generate plasmas at two perfectly separate positions that are close to the coils. It should be noted here that the phases of the high frequency electric powers supplied, respectively, to the inside and outside coils must be matched to each other.

Figure 10:
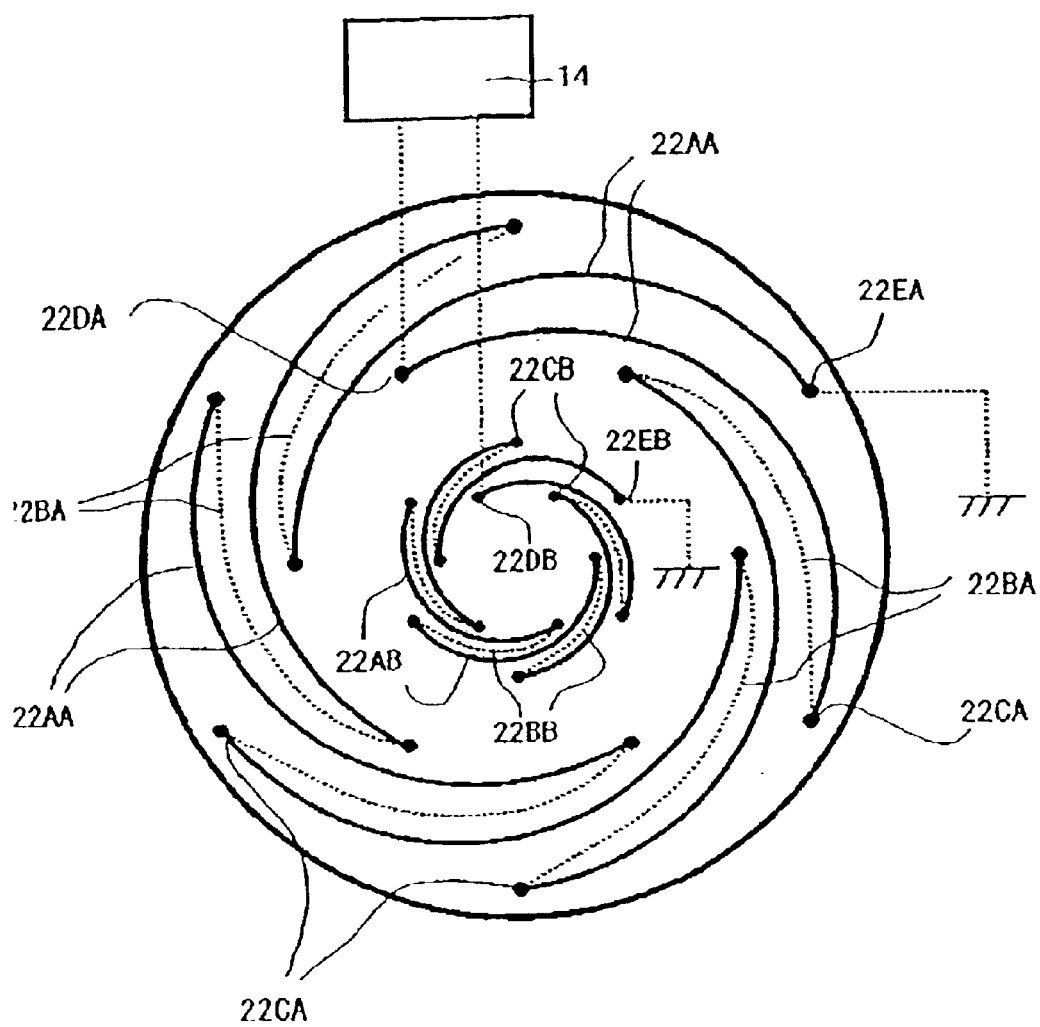
FIG. 10 is a diagram showing an eighth embodiment of the induction coil according to the present invention.

Here, in the embodiments shown in FIGS. 8 and 9, two systems of induction coils are provided, and the distribution of electric power to the coils is varied on a system basis, whereby the distribution of the plasma is controlled. FIG. 10 also shows an embodiment in which two systems of coils are arranged.

FIG. 10 shows an embodiment of the present invention in which two systems of induction coils, of the type comprising coil elements that deviate from the circular circumferential direction as shown in FIGS. 4 and 5, are provided. Therefore, this corresponds to the embodiment shown in FIG. 2.

According to the embodiment shown in FIGS. 1 and 2, the deviation of the plasma due to the manner of winding the coil can be prevented, and a uniform plasma can be securely generated.

According to the embodiment shown in FIGS. 1 and 2, the grounded conductor 19 is provided between the coil and the plasma, so that capacitive coupling between the coil and the plasma can be prevented, asymmetry due to capacitive coupling can be restrained, and axial symmetry of the plasma can be perfectly achieved.

Besides, according to the embodiment shown in FIGS. 1 and 2, the coil elements 12A, 13A can be arranged so as to overlap with each other, so that the number of coils can be increased. As a result, uniformity in the circular circumferential direction is further enhanced, and the electron temperature of the plasma being generated can be suppressed to a low level.

In all of the above embodiments, both end portions of each of the coil elements 12A, 13A, 22A are led out to the atmosphere side, and each coil element has a comparatively short length of not more than one turn. Therefore, according to the above embodiments of the present invention, when each of the coil elements 12A, 13A, 22A is formed of a material having a comparatively good thermal conductivity, such as aluminum, the heat of each coil element is transmitted to the atmospheric air side, so that temperature rise due to heat generation at each coil element can be easily suppressed. As a result, according to the above embodiments, temperature control of the process chamber is facilitated, and simplification of the structure can be achieved.

Figure 11:
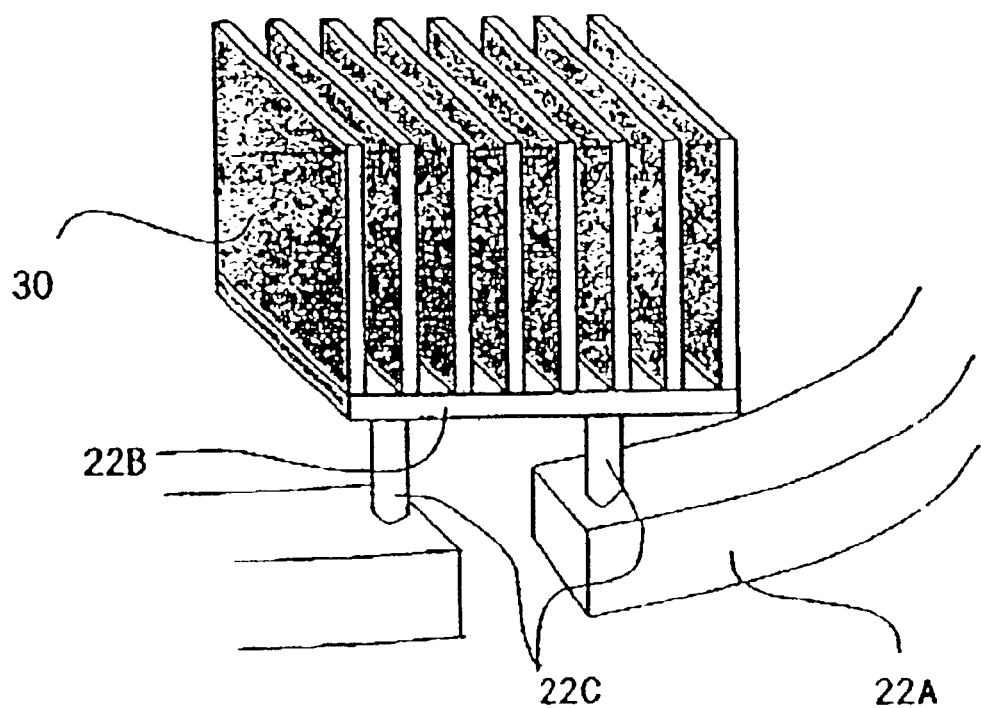
FIG. 11 is diagrammatic perspective view of a ninth embodiment of the induction coil according to the present invention.

In this case, if required, heat radiation by the lead wire portions may be further promoted. FIG. 11 shows an embodiment of the present invention in which it is possible to achieve promotion of the heat radiation at the lead wire portions. As shown, for example, a conductor 30 provided with cooling fins is provided as the lead wire portion 22B in the atmospheric air for the coil element 22A.

The conductor 30 provides a wide heat transfer area for the atmospheric air, and it functions to efficiently dissipate the heat transmitted from the coil elements 22A, so that a predetermined cooling function according to the ambient temperature can be obtained. If required, forced air cooling, such as cooling by a fan, may be applied.

In FIG. 11, other component parts than the coil elements are omitted, for easy understanding. Actually, the conductor 30 is disposed on the atmosphere side, and the coil elements 22A are disposed on the vacuum side. In this case, taking cooling into account, it is advantageous that each coil element is short in length, desirably less than one turn.

While various embodiments, in the case of applying the present invention to a plasma etching apparatus for production of semiconductor devices, have been taken as examples in the above description, the present invention is not limited to the above-mentioned plasma etching apparatus. The present invention is applicable also to a plasma CVD apparatus, a plasma ashing system, a plasma sputtering apparatus and the like. Further, the present invention is naturally applicable not only to the processing of semiconductor devices, but also to the processing of a liquid crystal display substrate and other surface treatments in general.

According to the present invention, as described above, the plasma generation region in the process chamber can be made uniform over a wide range, the acceleration distance for electrons can be shortened, and the electron temperature can be lowered.

Thus, a uniform plasma distribution can be obtained even if the wafer is located near the plasma generation region, and the lowering of the electron temperature has the effect of reducing charge-up damage.

In addition, according to the present invention, the plurality of systems of induction coils are arranged in such a way that plasma can be generated for each of the coils, and the distribution of the plasma and radicals can be freely controlled.

Further, according to the present invention, the coil is divided into coil elements and the coil elements are connected on the atmosphere side, whereby advantageous effects can be obtained in that a uniform plasma distribution can be achieved and efficient cooling of the coil can be achieved, notwithstanding the fact that the coil is located on the vacuum side.

As a result of the above, the total performance of the plasma processing and the availability factor of the apparatus can be enhanced. In addition, it is possible to realize not only minute etching processing under high throughput, but also high-quality film formation, surface treatment and the like.

While the invention has been described with reference to various preferred embodiments, it is to be understood that the terms which have been used in the description are terms of description rather than limitation, and that changes within the purview of the appended claims may be made without departing from the true scope and spirit of the invention in its broader aspects.

What is claimed is:

1. An plasma processing apparatus comprising:
   a process chamber in which an inner side thereof is under a vacuum condition and having an electrode on an inside thereof, the electrode enabling mounting of a sample wafer thereon;
   a cover plate consisting of an insulating material being mounted on an upper side of the process chamber;
   at least one system of an induction coil supplied with an electric power for generating a plasma inside said process chamber including at least one turn of the induction coil wound above the electrode;
   wherein the at least one turn of the induction coil is divided into a plurality of arc portions disposed inside the cover plate so as to be on a vacuum side of the process chamber, and at least one connecting portion for connecting an end of one arc portion with an end of another arc portion, the at least one connecting portion having at least one part which is disposed in the atmosphere outside of the cover plate and which consists of thermally conductive material.

2. A plasma processing apparatus as set forth in claim 1, wherein the at least one part of the connecting portion is air cooled outside of the cover plate.

3. A plasma processing apparatus as set forth in claim 1, wherein the at least one part of the connection portion is connected with cooling fins.

4. A plasma processing apparatus comprising:
   a process chamber having an electrode inside thereof, the electrode enabling mounting of a sample wafer thereon;
   a cover plate consisting of an insulating material being mounted on an upper side of the process chamber;
   at least one system of an induction coil supplied with an electric power for generating a plasma inside the process chamber including a plurality of turns of the induction coil wound above the electrode, which are disposed such as an inner turn and an outer turn;
   wherein each of the turns of the induction coil is divided into a plurality of arc portions symmetrically arranged with respect to a center above the electrode, and at least one connecting portion connects an end of an arc portion of an inner turn with an end of an arc portion of an outer turn, the at least one connecting portion having at least one part which is disposed at a position above the inner turn and the outer turn.

5. A plasma processing apparatus as set forth in claim 4, wherein the arc portion of the inner turn is disposed overlapping circumferentially with the arc portion of the outer turn.

6. A plasma processing apparatus as set forth in claim 4, wherein the plurality of the arc portions are disposed inside the cover plate.

7. A plasma processing apparatus as set forth in claim 4, wherein the plurality of the arc portions are arranged as parts of a concentric circle above the electrode.

8. A plasma processing apparatus comprising:
   a process chamber having an electrode inside thereof, the electrode enabling mounting of a sample wafer thereon;
   a cover plate consisting of an insulating material being mounted on an upper side of the process chamber;
   at least one system of an induction coil supplied with an electric power for generating a plasma inside the process chamber including a plurality of turns of the induction coil wound above the electrode;
   wherein each of the turns of the induction coil is divided into a plurality of arc portions symmetrically arranged with respect to a center above the electrode in a form of parts of spiral starting from an interior area of the turn and extending to an exterior area of the turn, and at least one connecting portion connects an end of one arc portion at an interior area of the turn with an end of an other arc portion at an exterior area of the turn, the at least one connecting portion being at least one part disposed at a position above a position of the arc portions of the turn.

9. A plasma processing apparatus according to claim 8, wherein each of the arc portions is disposed in overlapping circumferential relation with an adjacent arc portion.

10. A plasma processing apparatus as set forth in any one of claims 1 to 9, wherein a conductive plate member having slits extending in directions substantially orthogonal to the plurality of arc portions is provided between the turn of the induction coil and a plasma generation space in the process chamber.

* * * * *